(12) United States Patent
Siddiqui et al.

(10) Patent No.: US 7,915,071 B2
(45) Date of Patent: Mar. 29, 2011

(54) METHOD FOR CHEMICAL MECHANICAL PLANARIZATION OF CHALCOGENIDE MATERIALS

(75) Inventors: Junaid Ahmed Siddiqui, Richmond, VA (US); Saifi Usmani, Taipei (TW)

(73) Assignee: DuPont Air Products Nanomaterials, LLC, Allentown, PA (US)

(*) Notice: Subject to any disclaimer, the term of this patent is extended or adjusted under 35 U.S.C. 154(b) by 35 days.

(21) Appl. No.: 12/193,303

(22) Filed: Aug. 18, 2008

(65) Prior Publication Data

US 2009/0057661 A1    Mar. 5, 2009

Related U.S. Application Data

(60) Provisional application No. 60/968,916, filed on Aug. 30, 2007.

(51) Int. Cl.
*H01L 21/00* (2006.01)

(52) U.S. Cl. .............. 438/95; 438/102; 257/E21.214; 257/E21.23

(58) Field of Classification Search ............ 438/102, 438/95; 257/E21.23, E21.214
See application file for complete search history.

(56) References Cited

U.S. PATENT DOCUMENTS

| | | | |
|---|---|---|---|
| 4,522,928 A * | 6/1985 | McVicker et al. ............ 502/26 |
| 5,972,792 A | 10/1999 | Hudson |
| 6,083,838 A | 7/2000 | Burton et al. |
| 6,527,622 B1 | 3/2003 | Brusic et al. |
| 6,635,186 B1 | 10/2003 | Small et al. |
| 6,702,954 B1 | 3/2004 | Her et al. |
| 6,743,267 B2 | 6/2004 | Jernakoff et al. |
| 6,795,338 B2 | 9/2004 | Parkinson et al. |
| 6,852,632 B2 | 2/2005 | Wang et al. |
| 6,855,266 B1 | 2/2005 | Wang et al. |
| 6,867,140 B2 | 3/2005 | Wang et al. |
| 6,869,336 B1 | 3/2005 | Hardikar |
| 6,884,144 B2 | 4/2005 | Chandrasekaran et al. |
| 6,893,476 B2 * | 5/2005 | Siddiqui et al. ............ 51/307 |
| 6,936,543 B2 | 8/2005 | Schroeder et al. |
| 6,974,777 B2 | 12/2005 | Moeggenborg et al. |
| 7,077,880 B2 * | 7/2006 | Siddiqui ............... 51/307 |
| 7,241,725 B2 | 7/2007 | Bian |
| 7,247,566 B2 | 7/2007 | Carter et al. |
| 7,276,180 B2 | 10/2007 | Small et al. |
| 2002/0005017 A1 * | 1/2002 | Motonari et al. ............ 51/307 |
| 2002/0055323 A1 * | 5/2002 | McClain et al. ............ 451/41 |
| 2003/0077985 A1 * | 4/2003 | Zhou et al. ............ 451/41 |
| 2004/0077295 A1 * | 4/2004 | Hellring et al. ............ 451/41 |
| 2004/0107650 A1 * | 6/2004 | Siddiqui et al. ............ 51/307 |
| 2005/0070109 A1 | 3/2005 | Feller et al. |
| 2005/0090109 A1 * | 4/2005 | Carter et al. ............ 438/692 |
| 2005/0178742 A1 | 8/2005 | Chelle et al. |
| 2005/0194563 A1 | 9/2005 | Siddiqui et al. |
| 2006/0037942 A1 | 2/2006 | Yun et al. |
| 2006/0096179 A1 * | 5/2006 | Lu et al. ............ 51/307 |
| 2006/0117667 A1 | 6/2006 | Siddiqui et al. |
| 2006/0255015 A1 | 11/2006 | Siddiqui |
| 2007/0075042 A1 | 4/2007 | Siddiqui et al. |
| 2007/0170881 A1 * | 7/2007 | Noh et al. ............ 318/453 |
| 2007/0251156 A1 | 11/2007 | Siddiqui |
| 2008/0182485 A1 | 7/2008 | Siddiqui et al. |
| 2008/0190035 A1 * | 8/2008 | Lu et al. ............ 51/307 |

FOREIGN PATENT DOCUMENTS

| | | |
|---|---|---|
| KR | 10-0459580 | 12/2004 |
| KR | 10-2005-0030582 | 3/2005 |
| KR | 10-0489458 | 5/2005 |

OTHER PUBLICATIONS

Gregory B. Shinn, et al., Chemical-Mechanical Polish, Handbook of Semiconductor Mfg.Tech, Chapter 15, 2000, pp. 415-460.

* cited by examiner

*Primary Examiner* — Matthew C Landau
*Assistant Examiner* — Vicki B Booker
(74) *Attorney, Agent, or Firm* — Geoffrey L. Chase

(57) ABSTRACT

A method and associated composition for chemical mechanical planarization of a chalcogenide-containing substrate (e.g., germanium/antimony/tellurium (GST)-containing substrate) are described. The composition and method afford low defect levels (e.g., scratches incurred during polishing) as well as low dishing and local erosion levels on the chalcogenide-containing substrate during CMP processing.

15 Claims, No Drawings

METHOD FOR CHEMICAL MECHANICAL PLANARIZATION OF CHALCOGENIDE MATERIALS

CROSS REFERENCE TO RELATED APPLICATION

This patent application claims the benefit of U.S. Provisional Patent Application Ser. No. 60/968,916 filed 30 Aug. 2007.

BACKGROUND OF THE INVENTION

This invention relates generally to the chemical-mechanical planarization (CMP) of substrates containing chalcogenide materials (e.g., germanium/antimony/tellurium alloy) on semiconductor wafers and slurry compositions therefor. In particular, the present invention relates to a CMP method using an associated slurry composition that is effective for use in chalcogenide CMP and which affords low defect counts (e.g., scratches incurred during polishing) and low dishing levels on polished substrates following CMP processing. This invention is especially useful for CMP of chalcogenide alloy materials where low defect counts and dishing levels on planarized substrates is desired.

Chalcogenide materials possess the property of undergoing phase changes with different phases having different electrical properties and thereby have potential applications in new memory devices. The Germanium, Antimony, and Tellerium (GST) alloy is one of many in a family of phase change chalcogenide materials being considered for use in future advanced memory devices. If successful, these devices could replace many of the memory chips currently used today (DRAM, Flash, etc.) and become a major new market. The GST material typically is deposited onto the surface of a wafer and into various features etched into the surface of the wafer during the construction of the memory devices. The overburden of material above and between the etched features is required to be removed. The state of the art technique for removing this material overburden is chemical mechanical polishing (CMP).

Memory having access devices using phase change material such as chalcogenide is known; see, for example, U.S. Pat. No. 6,795,338. Such phase change memory devices use phase change materials, i.e., materials that may be electrically switched between a generally amorphous state and a generally crystalline state, for electronic memory applications (as is reported in this patent).

Chemical mechanical planarization (chemical mechanical polishing, CMP) for planarization of semiconductor substrates is now widely known to those skilled in the art and has been described in numerous patents and open literature publications. An introductory reference on CMP is as follows: "Chemical-Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

In a typical CMP process, a substrate (e.g., a wafer) is placed in contact with a rotating polishing pad attached to a platen. A CMP slurry, typically an abrasive and a chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad relative to the substrate. Polishing is continued in this manner until the desired film on the substrate is removed with the usual objective being to effectively planarize the substrate. Typically CMP slurries for polishing metals, including chalcogenide alloys, contain an abrasive material, such as silica or alumina, suspended in an oxidizing, aqueous medium.

Silicon based semiconductor devices, such as integrated circuits (ICs), typically include a dielectric layer, which can be a low-k dielectric material, silicon dioxide, or other material. Multilevel circuit traces, typically formed from aluminum or an aluminum alloy or copper, are patterned onto the low-k or silicon dioxide substrate. In case of advanced memory devices as referenced supra, chalcogenide materials that are capable of undergoing phase changes may also be deposited in manufacture of these advanced semiconductor devices.

CMP processing is often employed to remove and planarize excess metal (e.g., removal of overburden chalcogenide alloys) at different stages of semiconductor manufacturing. For example, one way to fabricate a multilevel metal (e.g., copper as referenced below) interconnect or planar metal (e.g., copper) circuit traces on a silicon dioxide substrate is referred to as the damascene process. In a semiconductor manufacturing process typically used to form a multilevel copper interconnect, metallized copper lines or copper vias are formed by electrochemical metal deposition followed by copper CMP processing. In a typical process, the interlevel dielectric (ILD) surface is patterned by a conventional dry etch process to form vias and trenches for vertical and horizontal interconnects and make connection to the sublayer interconnect structures. The patterned ILD surface is coated with an adhesion-promoting layer such as titanium or tantalum and/or a diffusion barrier layer such as titanium nitride or tantalum nitride over the ILD surface and into the etched trenches and vias. The adhesion-promoting layer and/or the diffusion barrier layer is then overcoated with copper, for example, by a seed copper layer and followed by an electrochemically deposited copper layer. Electro-deposition is continued until the structures are filled with the deposited metal. Finally, CMP processing is used to remove the copper overlayer, adhesion-promoting layer, and/or diffusion barrier layer, until a planarized surface with exposed elevated portions of the dielectric (silicon dioxide and/or low-k) surface is obtained. The vias and trenches remain filled with electrically conductive copper forming the circuit interconnects.

When one-step metal CMP processing is desired, it is usually important that the removal rate of the metal and barrier layer material be significantly higher than the removal rate for dielectric material in order to avoid or minimize dishing of metal features or erosion of the dielectric. Alternatively, a multi-step metal CMP process may be employed involving the initial removal and planarization of the metal overburden, referred to as a step 1 metal CMP process, followed by a barrier layer CMP process. The barrier layer CMP process is frequently referred to as a barrier or step 2 metal CMP process. Previously, it was believed that the removal rate of the metal and the adhesion-promoting layer and/or the diffusion barrier layer must both greatly exceed the removal rate of dielectric so that polishing effectively stops when elevated portions of the dielectric are exposed. The ratio of the removal rate of a metal to the removal rate of dielectric base is called the "selectivity" for removal of the metal in relation to dielectric during CMP processing of substrates comprised of the metal and dielectric material. When CMP slurries with high selectivity for removal of a metal(s) in relation to a dielectric are used, the metal layer(s) is easily over-polished creating a depression or "dishing" effect in the metal vias and trenches. This feature distortion is unacceptable due to lithographic and other constraints in semiconductor manufacturing.

Another feature distortion that is unsuitable for semiconductor manufacturing is called "erosion." Erosion is the topography difference between a field of dielectric and a dense array of metallic vias or trenches. In CMP, the materials in the dense array may be removed or eroded at a faster rate than the surrounding field of dielectric. This causes a topography difference between the field of dielectric and the dense metal array.

A typically used CMP slurry has two actions, a chemical component and a mechanical component. An important consideration in slurry selection for metal CMP (e.g., chalcogenide alloy CMP) is "passive etch rate." The passive etch rate is the rate at which metal is dissolved by the chemical component alone and should be significantly lower than the removal rate when both the chemical component and the mechanical component are involved. A large passive etch rate leads to dishing of the metal trenches and vias, and thus, preferably, the passive etch rate is less than 10 nanometers per minute.

These are two general types of layers that can be polished. The first layer is interlayer dielectrics (ILD), such as silicon oxide and silicon nitride. The second layer is metal layers such as tungsten, copper, aluminum, etc., which are used to connect the active devices or chalcogenide alloys, which are used within the active devices.

In the case of CMP of metals (e.g., chalcogenide alloys), the chemical action is generally considered to take one of two forms. In the first mechanism, the chemicals in the solution react with the metal layer to continuously form an oxide layer on the surface of the metal. This generally requires the addition of an oxidizer to the solution such as hydrogen peroxide, ferric nitrate, periodic acid, etc. Then the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal and enhancing the diffusion of reactants and products to and away from the surface by mixing and by reducing the thickness of the boundary layer.

While prior art CMP systems are capable of removing a metal overlayer(s) from a silicon dioxide substrate, the systems do not satisfy the rigorous demands of the semiconductor industry. These requirements can be summarized as follows. First, there is a need for high removal rates of metal(s) to satisfy throughput demands. Secondly, there must be excellent topography uniformity across the substrate. Finally, the CMP method must minimize dishing and local erosion effects on polished substrates as well as minimizing defectivity levels to satisfy ever increasing lithographic demands.

There is a significant need for metal CMP process(es) and slurry(s) that are applicable to efficient CMP processing of substrates containing chalcogenide alloys and that afford low dishing and local erosion effects as well as low defectivity levels. These requirements are especially important in view of the fact that the semiconductor industry continues to move towards smaller and smaller feature sizes. The present invention provides a solution to this significant need.

BRIEF SUMMARY OF THE INVENTION

In an embodiment, the invention is a method for chemical mechanical planarization of a surface having at least one feature thereon comprising a chalcogenide material, said method comprising the steps of:
A) placing a substrate having the surface having the at least one feature thereon comprising a chalcogenide material in contact with a polishing pad;
B) delivering a polishing composition comprising:
   a) a surface-modified abrasive having a positive zeta potential; and
   b) an oxidizing agent;
and
C) polishing the substrate with the polishing composition.

In another embodiment, the invention is a substrate having a surface, the surface having at least one feature thereon comprising a chalcogenide material, wherein the substrate is made by the method as listed above. In an embodiment, the substrate is made using the method as shown above wherein the surface-modified abrasive is a surface-modified silica. In an embodiment, the substrate is made using the method as shown above wherein the polishing composition further comprises comprises c) a $C_2$-$C_4$ carboxylic acid. In an embodiment, the substrate is made using the method as shown above (immediately preceding paragraph) wherein the polishing composition further comprises c) acetic acid.

DETAILED DESCRIPTION OF THE INVENTION

This invention involves a method using associated polishing compositions (slurries) for polishing of chalcogenide materials and, in particular, for chemical mechanical planarization of chalcogenide materials. The associated polishing compositions comprise a surface-modified abrasive (e.g., aluminum acetate-modified colloidal silica) and an oxidizing agent. Such compositions have been surprisingly and unexpectedly found to afford relatively high removal rates of chalcogenide materials (e.g., GST alloy) while simultaneously affording low defectivity levels. In certain embodiments, the associated polishing composition further comprises a selected corrosion inhibitor; use of this type of slurry in chalcogenide CMP further affords relatively low levels of dishing and static etch rates during the course of chalcogenide CMP (e.g., GST alloy CMP) relative to comparable compositions without the selected corrosion inhibitor. The prevention of dishing/erosion of features on semiconductor substrates during CMP processing is becoming increasingly more important as the semiconductor industry trends to smaller and smaller feature sizes in the manufacture of integrated circuits.

Suitable surface-modified abrasives for this invention have a positive zeta potential and include, but are not limited to, a surface-modified silica, a surface-modified alumina, a surface-modified ceria, a surface-modified titania, and combinations thereof. In an embodiment, the surface-modified abrasive is selected from the group consisting of a surface-modified silica, a surface-modified alumina, a surface-modified ceria, a surface-modified titania, and combinations thereof. In one embodiment, the surface-modified abrasive is colloidal silica.

Suitable surface-modified abrasives for this invention also include abrasives that are initially surface-modified with an inorganic compound to afford an initial surface-modified abrasive having a negative zeta potential and which modification is in or as a first layer. This initial surface-modified abrasive is then further surface-modified with an organic ligand(s) in second and/or third layers to give a resulting two or three layer surface-modified abrasive that upon addition of the organic ligand(s) now has a positive zeta potential. An example is colloidal silica which has been treated with boric acid to afford boron surface-modified colloidal silica, which has a negative zeta potential. Treatment of the latter with an immobilizing organic ligand, such as bicine, results in further surface-modification such that the resulting abrasive particle (now modified with both boric acid and bicine) has a positive zeta potential. This dual surface modification with both an inorganic compound(s) and an organic ligand(s) is described in copending patent application Ser. No. 11/700,526 (U.S. patent application publication 2008/0182485, published on Jul. 31, 2008), which is incorporated by reference. Surface-modification of an abrasive (e.g., colloidal silica) with a boron compound (e.g., boric acid) is described in U.S. Pat. No. 6,743,267, which is incorporated by reference.

For CMP processing of certain chalcogenide substrates according to the invention, the oxidizing agent can be any one or more of a wide range of oxidizing agents. In these embodiments, suitable oxidizing agents include, for example, one or more per-compounds, which comprise at least one peroxy group (—O—O—). Suitable per-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., chlorates, bromates, iodates, perchlorates, perbromates, periodates, and acids thereof, and mixtures thereof, and the like), perboric acid, perborates, percarbonates, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricyanide), nitrates, mixtures thereof, and the like. Some specific oxidizers that are useful in this invention include, but are not limited to, hydrogen peroxide, urea hydrogen peroxide, periodic acid, benzoyl peroxide, 2-butanone peroxide, tert-butyl hydroperoxide, cumeme hydroperoxide, di-tert-amyl peroxide, dicumyl peroxide, lauroyl peroxide, 2,4-pentanedione peroxide, potassium iodate, potassium permanganate, ammonium persulfate, ammonium molybdate, ferric nitrate, nitric acid, potassium nitrate, ammonia, and other amine compounds, and mixtures thereof. In an embodiment, the oxidizing agents are potassium nitrate and hydrogen peroxide.

Levels of oxidizing agent in a slurry can range from about 0.01 weight percent to about 5 weight percent. In an embodiment, the level of oxidizing agent is in the range of 0.5 weight percent to 3 weight percent. In another embodiment, the level of oxidizing agent is in the range of 1 weight percent to 3 weight percent. In another embodiment, the level of oxidizing agent is in the range of 0.5 weight percent to 2 weight percent. In another embodiment, the level of oxidizing agent is in the range of 0.1 weight percent to 0.5 weight percent.

In an embodiment according to the invention, the polishing composition further comprises c) a corrosion inhibitor. Suitable corrosion inhibitors include, but are not limited to, dimethylhexyndiol and diethylenetriamine pentaacetic acid.

The levels of corrosion inhibitors and/or surfactant additives used in the compositions can range from about 0.1 ppm to about 100 ppm. In an embodiment, this range is about 1 ppm to about 100 ppm. In another embodiment, this range is about 10 ppm to 60 ppm. In yet another embodiment, this range is about 10 ppm to about 50 ppm. In another embodiment, this range is about 10 ppm to about 40 ppm. In yet another embodiment, this range is about 20 ppm to about 40 ppm.

The slurry compositions used in the method of this invention can have pH values that range from highly acidic to highly basic and include neutral pH of 7. Acidic pH values can range from about 1 to less than 7. In an embodiment the pH ranges from about 1 to less than 5. In another embodiment, the pH ranges from about 1 to about 4; in yet another, from about 1 to about 3; and in yet another, from about 1 to about 2. Basic pH values in other embodiments can range from >7 to about 14.

The (surface-modified) abrasive level in the slurry can broadly range from a concentration of about 10 ppm to about 25 weight % of the total weight of the slurry. In a preferred embodiment, the abrasive level is relatively low and ranges from about 10 ppm to about 2 weight percent. In an embodiment, the abrasive level is about 10 ppm to about 1 weight percent; in another embodiment, the abrasive level ranges from about 25 ppm to about 100 ppm.

Other chemicals that may be added to the CMP slurry composition according to the method include, for example, surfactants, pH-adjusting agents, acids, additional corrosion inhibitors, fluorine-containing compounds, chelating agents, nitrogen-containing compounds, and salts.

Suitable surfactant compounds that may be added to the slurry composition according to the method include, for example, any of the numerous nonionic, anionic, cationic or amphoteric surfactants known to those skilled in the art. The surfactant compounds may be present in the slurry composition in a concentration of about 0 weight % to about 1 weight % and, when present, are preferably present in a concentration of about 0.001 weight % to about 0.1 weight % of the total weight of the slurry.

The pH-adjusting agent is used to improve the stability of the polishing composition, to improve the safety in handling and use, and/or to meet the requirements of various regulations. Suitable pH-adjusting agents to lower the pH of the polishing composition according to the method of the present invention include, but are not limited to, hydrochloric acid, nitric acid, sulfuric acid, chloroacetic acid, tartaric acid, succinic acid, citric acid, malic acid, malonic acid, various fatty acids, various polycarboxylic acids and mixtures thereof. Suitable pH-adjusting agents to raise the pH of the polishing composition according to the method of the present invention include, but are not limited to, potassium hydroxide, sodium hydroxide, ammonia, tetramethylammonium hydroxide, ethylenediamine, piperazine, polyethyleneimine, modified polyethyleneimines, and mixtures thereof.

Suitable acid compounds that may be added to the slurry composition according to the method include, but are not limited to, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. These acid compounds may be present in the slurry composition in a concentration of about 0 weight % to about 3 weight % of the total weight of the slurry.

$C_2$-$C_4$ carboxylic acids are particularly useful components in the associated composition according to the method of this invention to increase the quality of the polished chalcogenide surfaces following CMP. These compounds act in a synergistic manner with the oxidizing agent(s). A suitable carboxylic acid of this type is acetic acid. Compositions according to the method that contain acetic acid are preferred embodiment.

To increase the removal rates of the slurry for various metals relative to silicon dioxide, fluorine-containing compounds may be added to the slurry composition according to the method. Suitable fluorine-containing compounds include, but are not limited to, hydrogen fluoride, perfluoric acid, alkali metal fluoride salt, alkaline earth metal fluoride salt, ammonium fluoride, tetramethylammonium fluoride, ammonium bifluoride, ethylenediammonium difluoride, diethylenetriammonium trifluoride, and mixtures thereof. The fluorine-containing compounds may be present in the slurry composition in a concentration of about 0 weight % to about 5 weight % in an embodiment, and can be present in a concentration of about 0.10 weight % to about 2 weight % of the total weight of the slurry in another embodiment. A preferred fluorine-containing compound is ammonium fluoride, most preferably present in a concentration of about 0 weight % to about 1 weight % of the total weight of the slurry.

Suitable chelating agents that may be added to the slurry composition according to the method include, but are not limited to, ethylenediaminetetracetic acid (EDTA), N-hydroxyethylethylenediaminetriacetic acid (NHEDTA), nitrilotriacetic acid (NTA), diethylenetriaminepentacetic acid (DPTA), ethanoldiglycinate, tricine, 2,2'-bipyridyl, tartaric acid, glutamic acid, aspartic acid, glutamine, L-aspartic acid, L-tryptophan, L-asparagine, L-arginine and mixtures thereof. The chelating agents may be present in the slurry composition in a concentration of about 0 weight % to about 3 weight % in an embodiment, and are present in a concentration of about 0.05 weight % to about 0.20 weight % of the total weight of the slurry in another embodiment. Preferred chelating agents are tricine and EDTA and, if present, are most preferably present in a concentration of about 0.05 weight % to about 0.20 weight % of the total weight of the slurry.

Suitable nitrogen-containing compounds that may be added to the slurry composition according to the method include, but are not limited to, ammonium hydroxide, hydroxylamine, monoethanolamine, diethanolamine, triethanolamine, diethyleneglycolamine, N-hydroxylethylpiperazine, polyethyleneimine, modified polyethyleneimines, and mixtures thereof. Suitable nitrogen-containing compounds also include various amino acids. Suitable amino acids include, but are not limited to, alanine, arginine, asparagine, aspartic acid, cysteine, glutamic acid, glutamine, glycine, histidine, isoleucine, leucine, lysine, methionine, phenylalanine, proline, serine, threonine, tryptophan, tyrosine, and valine. In an embodiment, the amino acid is glycine. The nitrogen-containing compounds may be present in the slurry composition in a concentration of about 0 weight % to about 1 weight % in an embodiment, and are present in a concentration of about 0.01 weight % to about 0.20 weight % of the total weight of the slurry in another embodiment.

Suitable additional corrosion inhibitors for use in the slurry composition according to the method of this invention are optional and include benzotriazole, 6-tolyltriazole, 1,2,3-triazole, 1,2,4-triazole, 1-dodecanethiol, 3-amino-triazole, 3-amino-1,2,3-triazole-5-thiol, 1-phenyl-1H-tetrazole-5-thiol, 2-mercaptobenzothiazole, hexanethiol, 5-methyl-1H-benzotriazole, 2-amino-4-thiazole-acetic acid, dodecanethiol and combinations thereof. If present, these additional corrosion inhibitors are at levels in the range from about 0.01 weight % to about 1 weight %.

Suitable salts that may be added to the slurry composition according to the method include, but are not limited to, ammonium persulfate, potassium persulfate, potassium sulfite, potassium carbonate, ammonium nitrate, potassium hydrogen phthalate, hydroxylamine sulfate, and mixtures thereof. The salts may be present in the slurry composition in a concentration of about 0 weight % to about 10 weight % in an embodiment, and are preferably present in a concentration of about 0 weight % to about 5 weight % of the total weight of the slurry in another embodiment.

Still other chemicals that can be added to the slurry compositions are biological agents such as bactericides, biocides and fungicides especially if the pH is around about 6 to 9. Suitable biocides, include, but are not limited to, 1,2-benzisothiazolin-3-one; 2(hydroxymethyl)amino ethanol; 1,3-dihydroxymethyl-5,5dimethylhydantoin; 1-hydroxymethyl-5,5-dimethylhydantion; 3-iodo-2-propynyl butylcarbamate; glutaraldehyde; 1,2-dibromo-2,4-dicyanobutane; 5-chloro-2-methyl-4-isothiazoline-3-one; 2-methyl-4-isothiazolin-3-one; and mixtures thereof.

METHOD OF THE INVENTION

The method of this invention entails use of the aforementioned composition (as disclosed supra) for chemical mechanical planarization of substrates comprised of chalcogenide materials (e.g., GST alloy) and dielectric materials. In the method, a substrate (e.g., a wafer) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

In an embodiment, the invention is a method for chemical mechanical planarization of a surface having at least one feature thereon comprising a chalcogenide material, such as germanium/antimony/tin alloy (GST). The chalcogenide material can include, but is not limited to, an alloy comprising at least one element selected from the group consisting of germanium, antimony, tellurium, silicon, arsenic, phosphorous, indium, scandium, yttrium, lanthanum, boron, aluminum, gallium, thallium, nitrogen, bismuth, vanadium, tantalum, and niobium. In one embodiment, the chalcogenide material is an alloy of germanium, antimony, and tellurium. In another embodiment, the chalcogenide material is an alloy of indium, antimony, and tellurium.

The slurry composition and associated methods of this invention are effective for CMP of a wide variety of substrates, including substrates having dielectric portions that comprise materials having dielectric constants less than 3.3 (low-k materials). Suitable low-k films in substrates include, but are not limited to, organic polymers, carbon-doped oxides, fluorinated silicon glass (FSG), inorganic porous oxide-like materials, and hybrid organic-inorganic materials. Representative low-k materials and deposition methods for these materials are summarized below.

| Vendor | Trade Name | Deposition Method | Material |
| --- | --- | --- | --- |
| Air Products and Chemicals | MesoElk ® | Spin-on | Hybrid organic-inorganic |
| Applied Materials | Black Diamond | CVD | Carbon-doped oxide |
| Dow Chemical | SiLK ™, Porous SiLK ™ | Spin-on | Organic polymer |
| Honeywell Electronic Materials | NANOGLASS ® E | Spin-on | Inorganic oxide-like |
| Novellus Systems | CORAL ® | PECVD | Carbon-doped oxide |

PECVD = Plasma enhanced chemical vapor deposition
CVD = chemical vapor deposition

GLOSSARY

COMPONENTS

| | |
| --- | --- |
| GST | Germanium Antimony Tellurium |
| Polishing Pad | Polishing pad, IC1000 and Politex ®, were used during CMP, supplied by Rohm and Haas, Inc., Phoenix, AZ. |

PARAMETERS

General

| | |
| --- | --- |
| Å: | angstrom(s) - a unit of length |
| CMP: | chemical mechanical planarization = chemical mechanical polishing |
| CS: | carrier speed |
| DF: | Down force: pressure applied during CMP, units psi |
| EPD: | Endpoint Detection |
| min: | minute(s) |
| sec.: | second(s) |
| ml: | milliliter(s) |
| mV: | millivolt(s) |
| psi: | pounds per square inch |
| PS: | platen rotational speed of polishing tool, in rpm (revolution(s) per minute) |
| SF: | slurry flow, ml/min |
| Wgt: | Weight percent |

Removal Rates and Selectivities

| | |
| --- | --- |
| GST RR @ 1.5 psi | Measured GST removal rate at 1.5 psi downforce of the CMP tool |
| Ti RR @ 1.5 psi | Measured titanium removal rate at 1.5 psi downforce of the CMP tool |

The present invention is further demonstrated by the examples below.

EXAMPLES

The present invention pertains to the use of aluminum acetate modified silica, and synergistic combination of aluminum acetate modified silica in the presence of metal alloy (Gs, Sb, and Te) solubalizing agents such as acetic acid in the presence of oxidizers, such as potassium nitrate and $H_2O_2$, for chemical mechanical planarization of GST films.

In the following two tables, Table 1, and Table 2, effect of acetic acid, potassium nitrate, $H_2O_2$ concentration using surface modified silica and aluminum acetate modified silica is summarized:

TABLE 1

Effect of Surface Modification of Silica on the Removal Rates of Germanium-Antimony-Tellurium (GST) wafers

| Sample | Example 1: Control, no surface modifcation | Example 2: Inventive example | Example 3: control no acetic acid/no $H_2O_2$ | Example 4 Control acetic acid/no $H_2O_2$ | Example 5: | Example 6: |
| --- | --- | --- | --- | --- | --- | --- |
| Silica, wt %, Silica 3050 D, acid stabilized silica | 1 | 0 | 1 | 1 | 1 | 2 |
| Aluminum acetate modified silica | 0 | 1 | 0 | 0 | 0 | 0 |
| Acetic acid, wt % | 1 | 1 | 0 | 1 | 1 | 1 |
| Potassium nitrate, wt % | 3 | 3 | 3 | 3 | 1 | 3 |
| $H_2O_2$, wt % | 3 | 3 | 0 | 0 | 0 | 0 |
| pH | 4.0 | 4.0 | 4.0 | 4.0 | 4.0 | 4.0 |
| Removal rate of GST wafer, A/min | 648 | 1651 | 444 | 551 | 497 | 592 |
| Scratch on GST wafer | no | no | High scratch | High scratch | High scratch | High scratch |

TABLE 2

GST Removal Rates at Different Concentrations of Acetic acid, Potassium nitrate, H2O2 Using Surface Modified Silica, Comparison with the Inventive Example, pH = 4.0

| Sample | Example 2/7: Inventive example | Example 8: | Example 9: | Example 10 | Example 11: | Example 12: |
|---|---|---|---|---|---|---|
| Aluminum acetate modified silica, wt. % | 1 | 1 | 1 | 1 | 1 | 2 |
| Acetic acid, wt % | 1 | 1 | 3 | 0 | 1 | 1 |
| Potassium nitrate, wt % | 3 | 1 | 3 | 3 | 3 | 3 |
| $H_2O_2$, wt % | 3 | 3 | 3 | 3 | 1 | 3 |
| pH | 4.0 | 4.0 | 4.0 | 4.0 | 4.0 | 4.0 |
| Removal rate of GST wafer, A/min | 1651 | 1180 | 895 | 1205 | 1134 | 1248 |
| Scratch on GST wafer | No scratch | No scratch | No scratch | Scratch | Scratch | Scratch |

Polishing results from Table 1 and Table 2 indicate the following results:

1) As shown in the inventive example in Table 1, control example 1 versus the inventive example 2, the aluminum acetate modified silica increased the removal rate of GST from 648 A/min to 1651 A/min, an increase of approximately 1000 A/min.
2) Addition of acetic acid from zero to 1 wt % increased the GST removal rate using aluminum acetate modified silica as well as uncoated silica, however relatively speaking, increase in GST removal rate were much lower for the uncoated silica.
3) Interestingly, an increase in acetic acid concentration from 1 wt % to 3 wt % decreases the GST removal rate, suggesting excessive coating of aluminum acetate silica, thus leading to reduced electrostatic interaction between GST wafer surface and surface modified silica.
4) Several other surface modified silica such as boron modified (negatively charged), and potassium aluminate modified silicas (negatively charged) were also evaluated. The negatively charged silica did not increase the GST removal rates, suggesting the role of electrostatic interaction between GST surface and particle surface.
5) As the concentration of potassium nitrate increased from zero to 5 wt %, the GST removal rate slightly increased, leveled out at 3 wt %. Interestingly, addition of potassium nitrate improved the surface quality of GST surface
6) Several concentration of $H_2O_2$ were evaluated form 0.25 wt % to 5 wt %, As the concentration of $H_2O_2$, a small increase in the removal rate of GST was observed, leveled out at 3 wt %.
7) Addition of $H_2O_2$, and potassium nitrate improved the surface quality of the GST surface with very low scratch.
8) A combination of $H_2O_2$, potassium nitrate, and acetic acid has synergistic improvement on the surface quality of polished GST wafer.
9) Several corrosion inhibitors were also evaluated in the GST formulation, Of the six compounds tested, namely two compounds, dimethylhexyndiol, and diethylenetriamine pentaacetic acid (DTPA) gave very low static etch rates 0.24 A/min vs 2.4 A/min for the control.
10) Effect of particle size on the removal rates of GST was also studied during polishing experiments. Interestingly, as the particle size increased, scratching on the GST wafer surface increased without any advantage in the GST removal rates. This observation suggests the chemical nature of GST removal rates during chemical mechanical planarization of GST. Hence an opportunity to find compounds which can catalyze GST removal rates, a chemically driven CMP.
11) The inventive slurry formulation was tested at different acidic pH conditions, the lowest defect count and optimum GST removal rates were observed at pH=4.
12) Aluminum modified silica (Ludox CL) from W. R. Grace was also evaluated for GST polishing experiments. As expected, positively charged Ludox CL behaved very much like aluminum acetate modified colloidal silica. Hence positively charged particles facilitate GST removal rates due to favorable electrostatic interaction between particle surface with the GST wafer surface at pH=4 in the presence of $H_2O_2$, acetic acid, and potassium nitrate.

All percentages are weight percentages unless otherwise indicated.

While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

The invention claimed is:

1. A method for chemical mechanical planarization of a surface having at least one feature thereon comprising a chalcogenide material, said method comprising the steps of:
   A) placing a substrate having the surface having the at least one feature thereon comprising a chalcogenide material in contact with a polishing pad;
   B) delivering a polishing composition comprising:
      a) a surface-modified abrasive having a positive zeta potential; and
      b) an oxidizing agent;
      and
   C) polishing the substrate with the polishing composition; wherein the chalcogenide material is removed with a removal rate of at least 895 angstroms/minute at 1.5 psi downforce.

2. The method of claim 1 wherein the chalcogenide material is an alloy comprising at least one element selected from the group consisting of germanium, antimony, tellurium, silicon, arsenic, phosphorous, indium, scandium, yttrium, lanthanum, boron, aluminum, gallium, thallium, nitrogen, bismuth, vanadium, tantalum, and niobium.

3. The method of claim 1 wherein the chalcogenide material is an alloy of germanium, antimony, and tellurium.

4. The method of claim 1 wherein the chalcogenide material is an alloy of indium, antimony, and tellurium.

5. The method of claim 1 wherein the surface-modified abrasive is selected from the group consisting of a surface-modified silica, a surface-modified alumina, a surface-modified ceria, a surface-modified titania, and combinations thereof.

6. The method of claim 5 wherein the surface-modified abrasive is a surface-modified silica.

7. The method of claim 6 wherein the surface-modified abrasive is an aluminum acetate modified silica.

8. The method of claim 1 wherein the polishing composition has a pH that is acidic and is less than 7.

9. The method of claim 1 wherein the polishing composition further comprises c) a corrosion inhibitor.

10. The method of claim 1 wherein the corrosion inhibitor is selected from the group consisting of dimethylhexyndiol and diethylenetriamine pentaacetic acid.

11. The method of claim 1 wherein the polishing composition further comprises a $C_2$-$C_4$ carboxylic acid, wherein the $C_2$-$C_4$ carboxylic acid is selected from acetic acid, propanoic acid, and butanoic acid.

12. The method of claim 11 wherein the $C_2$-$C_4$ carboxylic acid is acetic acid.

13. The method of claim 1 wherein the surface-modified abrasive having a positive zeta potential is an abrasive that has initially been surface-modified with an inorganic compound and subsequently surface-modified with an organic ligand.

14. The method of claim 13 wherein the inorganic compound is boric acid.

15. The method of claim 13 wherein the organic ligand is bicine.

* * * * *